United States Patent
Lee et al.

(10) Patent No.: US 10,461,133 B2
(45) Date of Patent: Oct. 29, 2019

(54) LIGHT EMITTING DISPLAY DEVICE INCLUDING AN INFRARED RAY LIGHT EMITTING DIODE

(71) Applicant: Samsung Display Co., Ltd., Yongin-si, Gyeonggi-do (KR)

(72) Inventors: Heun Seung Lee, Suwon-si (KR); Hyo Yeon Kim, Hwaseong-si (KR); Hyun Shik Lee, Incheon (KR); Jae Hoon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/920,152

(22) Filed: Mar. 13, 2018

(65) Prior Publication Data

US 2019/0096959 A1    Mar. 28, 2019

(30) Foreign Application Priority Data

Sep. 25, 2017   (KR) .................. 10-2017-0123593

(51) Int. Cl.
*H01L 51/52* (2006.01)
*H01L 27/32* (2006.01)
(Continued)

(52) U.S. Cl.
CPC ...... *H01L 27/3213* (2013.01); *H01L 51/5004* (2013.01); *H01L 51/5096* (2013.01); *H01L 51/5278* (2013.01); *H01L 27/3225* (2013.01); *H01L 51/006* (2013.01); *H01L 51/007* (2013.01); *H01L 51/0058* (2013.01); *H01L 51/0072* (2013.01); *H01L 51/0081* (2013.01); (Continued)

(58) Field of Classification Search
CPC .......... H01L 27/3213; H01L 2251/552; H01L 51/5004; H01L 51/5016
See application file for complete search history.

(56) References Cited

U.S. PATENT DOCUMENTS

| 7,989,090 B2 | 8/2011 | Thompson et al. |
| 8,674,964 B2 | 3/2014 | Huang et al. |

(Continued)

FOREIGN PATENT DOCUMENTS

| KR | 10-0552964 B1 | 2/2006 |
| KR | 10-2006-0079225 A | 7/2006 |

(Continued)

*Primary Examiner* — Daniel Whalen
(74) *Attorney, Agent, or Firm* — Lewis Roca Rothgerber Christie LLP

(57) ABSTRACT

A light emitting display device includes: a first electrode positioned on a substrate; a second electrode overlapping the first electrode; a red emission layer, a green emission layer, a blue emission layer, and an infrared ray emission layer emitting light of different wavelengths and positioned between the first electrode and the second electrode; a green resonance auxiliary layer positioned between the green emission layer and the first electrode; and a blocking layer positioned between the green resonance auxiliary layer and the green emission layer, wherein the infrared ray emission layer and the green resonance auxiliary layer include the same material, and LUMO energy of the blocking layer is larger than LUMO energy of a green light emitting dopant included in the green emission layer.

18 Claims, 5 Drawing Sheets

(51) Int. Cl.
*H01L 51/50* (2006.01)
*H01L 51/00* (2006.01)

(52) U.S. Cl.
CPC ...... *H01L 51/0085* (2013.01); *H01L 51/5012* (2013.01); *H01L 51/5016* (2013.01); *H01L 51/5265* (2013.01); *H01L 2051/0063* (2013.01); *H01L 2251/552* (2013.01); *H01L 2251/558* (2013.01)

(56) References Cited

U.S. PATENT DOCUMENTS

| | | |
|---|---|---|
| 9,401,460 B2 | 7/2016 | Fujita et al. |
| 2010/0133434 A1 | 6/2010 | Meng et al. |
| 2014/0034911 A1 | 2/2014 | Liu et al. |
| 2014/0117325 A1* | 5/2014 | Kwak ................ H01L 51/5096 257/40 |
| 2015/0179726 A1 | 6/2015 | Liu et al. |
| 2018/0151819 A1* | 5/2018 | Kim .................... H01L 51/5012 |
| 2018/0261652 A1* | 9/2018 | Kim ...................... H01L 27/305 |

FOREIGN PATENT DOCUMENTS

| | | |
|---|---|---|
| KR | 10-2011-0060494 A | 6/2011 |
| KR | 10-2015-0101509 A | 9/2015 |
| KR | 10-1561554 B1 | 10/2015 |

* cited by examiner

LIGHT EMITTING DISPLAY DEVICE INCLUDING AN INFRARED RAY LIGHT EMITTING DIODE

CROSS-REFERENCE TO RELATED APPLICATION

This application claims priority to and the benefit of Korean Patent Application No. 10-2017-0123593, filed in the Korean Intellectual Property Office on Sep. 25, 2017, the entire content of which is incorporated herein by reference.

BACKGROUND

1. Field

The present disclosure relates to a light emitting display device.

2. Description of the Related Art

A light emitting diode is an element in which holes supplied from an anode and electrons supplied from a cathode are combined in an organic emission layer to form excitons, and light is emitted while the excitons are stabilized (e.g., transition to a ground state).

The light emitting diode has several merits (such as a wide viewing angle, a fast response speed, a thin thickness, and lower power consumption) such that the light emitting diode is widely applied to various electrical and electronic devices (such as a television, a monitor, a mobile phone, etc.).

In the light emitting display device including the light emitting diode, there is a case that a sensor module must be added to realize a sensor (e.g., to provide a sensor function). In this case, the time and the cost required for the process of fabrication of the sensor module may be increased.

The above information disclosed in this Background section is only for enhancement of understanding of the background of the invention and therefore it may contain information that does not form the prior art that is already known to a person of ordinary skill in the art.

SUMMARY

Aspects and features according to exemplary embodiments are directed toward a light emitting display device including an infrared ray light emitting diode positioned in a display area and having excellent light emitting efficiency.

Objects to be solved by the embodiments of the present invention are not limited to the above-mentioned objects, and can be variously extended within the scope of the technical idea included in the present invention.

A light emitting display device according to an exemplary embodiment of the present invention includes: a first electrode on a substrate; a second electrode overlapping the first electrode; a red emission layer, a green emission layer, a blue emission layer, and an infrared ray emission layer between the first electrode and the second electrode and emitting light of different wavelengths from each other; a green resonance auxiliary layer between the green emission layer and the first electrode; and a blocking layer between the green resonance auxiliary layer and the green emission layer, wherein the infrared ray emission layer and the green resonance auxiliary layer include the same material, the green emission layer includes a green light emitting dopant, and LUMO energy of the blocking layer is larger than LUMO energy of the green light emitting dopant included in the green emission layer.

The LUMO energy of the blocking layer may be larger than −2.0 eV.

Triplet excitation energy T1 of the blocking layer may be larger than triplet excitation energy T1 of the green light emitting dopant.

The triplet excitation energy T1 of the blocking layer may be 2.7 eV or more.

A thickness of the blocking layer may be 150 Å or more.

The blocking layer may include at least two layers.

The infrared ray emission layer and the green resonance auxiliary layer may be positioned on a same layer.

The infrared ray emission layer and the green resonance auxiliary layer may include an infrared ray light emitting dopant.

The infrared ray light emitting dopant may include at least one selected from a metal complex compound, a donor-acceptor-donor (DAD) compound, and a lanthanide compound.

A light emitting display device according to an exemplary embodiment includes: a first electrode on a substrate; a second electrode overlapping the first electrode; a red emission layer, a green emission layer, a blue emission layer, and an infrared ray emission layer between the first electrode and the second electrode and emitting light of different wavelengths from each other; a green resonance auxiliary layer between the green emission layer and the first electrode; and a blocking layer between the green resonance auxiliary layer and the green emission layer, wherein the infrared ray emission layer and the green resonance auxiliary layer include the same material, the green emission layer includes a green light emitting dopant, and triplet excitation energy T1 of the blocking layer is larger than triplet excitation energy T1 of the green light emitting dopant.

According to the above-described exemplary embodiments, as the infrared ray light emitting diode is positioned in the display area along with the red, green, and blue light emitting diodes, a light emitting display device of which a process is simplified may be implemented.

Also, as a fingerprint sensor is implemented by replacing the physical button of the light emitting display device, the area of the display area may be increased.

Also, a light emitting display device having excellent light emitting efficiency may be provided.

DETAILED DESCRIPTION

Figure 1:
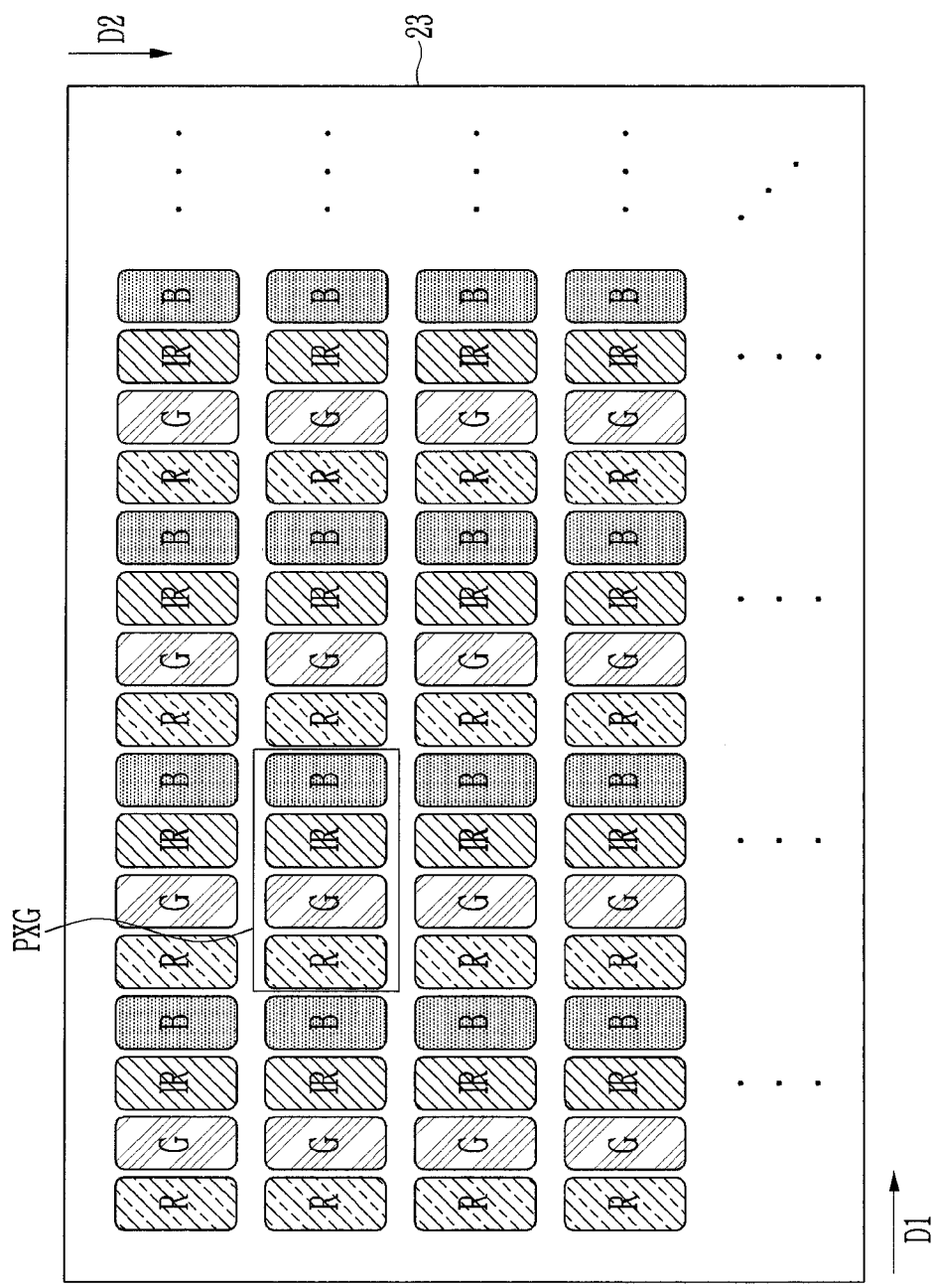
FIG. 1 is a top plan view showing an arrangement of a plurality of light emitting diodes according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, because sizes and thicknesses of constituent members shown in the accompanying drawings are arbitrarily given for better understanding and ease of description, the present invention is not limited thereto. In the drawings, the thickness of layers, films, panels, regions, areas, etc., are exaggerated for clarity and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" refers to positioned on or below the object portion, and does not necessarily mean positioned on the upper side of the object portion based on a gravitational direction.

In addition, unless explicitly described to the contrary, the word "comprise" and variations thereof such as "comprises" or "comprising" will be understood to imply the inclusion of stated elements but not the exclusion of any other elements.

Further, in this specification, the phrase "on a plane" refers to viewing a target portion from the top, and the phrase "on a cross-section" refers to viewing a cross-section formed by vertically cutting a target portion from the side.

Figure 2:
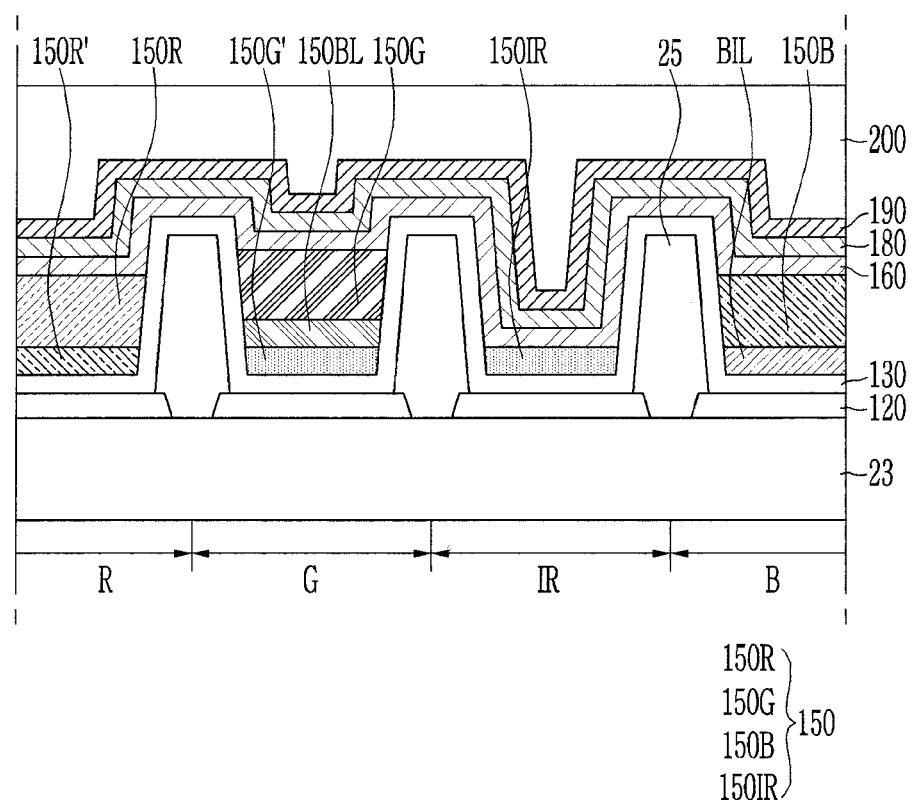
FIG. 2 is a schematic cross-sectional view showing a plurality of light emitting diodes in FIG. 1.
Figure 3:
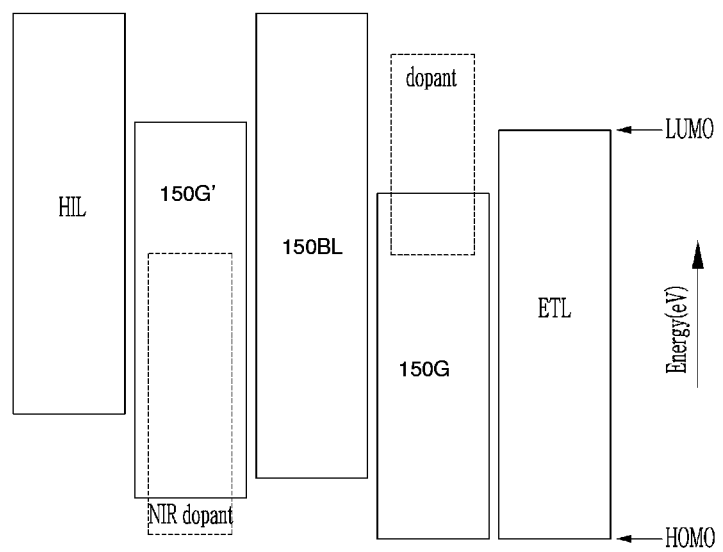
FIG. 3 is a schematic diagram of an energy level for each layer of a green light emitting diode according to an exemplary embodiment of FIG. 2.

Hereinafter, a light emitting display device according to an exemplary embodiment of the present invention will be described with reference to FIG. 1 to FIG. 3. FIG. 1 is a top plan view showing an arrangement of a plurality of light emitting diodes according to an exemplary embodiment of the present invention, FIG. 2 is a schematic cross-sectional view showing a plurality of (e.g., repeated) light emitting diodes in FIG. 1, and FIG. 3 is a schematic diagram of an energy level for each layer of a green light emitting diode according to an exemplary embodiment of FIG. 2.

Referring to FIG. 1, in the light emitting display device according to an exemplary embodiment, a red light emitting diode R, a green light emitting diode G, an infrared ray light emitting diode IR, and a blue light emitting diode B having different wavelengths from each other are arranged in a matrix on a substrate 23.

The red light emitting diode R, the green light emitting diode G, the infrared ray light emitting diode IR, and the blue light emitting diode B are alternately arranged along a first direction D1 on a plane. Light emitting diodes emitting light of the same wavelength may be arranged along a second direction D2 crossing the first direction D1.

The present specification describes an exemplary embodiment in which the infrared ray light emitting diode IR is positioned between the green light emitting diode G and the blue light emitting diode B, however, the present invention is not limited thereto, and it (i.e., the infrared ray light emitting diode IR) may be positioned between the red light emitting diode R and the blue light emitting diode B or between the red light emitting diode R and the green light emitting diode G.

Each of the red light emitting diode R, the green light emitting diode G, and the blue light emitting diode B may be a point indicating a contrast of a minimum unit constituting a screen (e.g., may be the smallest unit for forming a display). The infrared ray light emitting diode IR may be a region emitting infrared rays having a wavelength in a range of about 700 nanometers to 1000 nanometers, required for a function such as an illuminance sensor, a proximity sensor, a fingerprint sensor, an iris recognition sensor, a vein sensor, etc.

The red light emitting diode R, the green light emitting diode G, the infrared ray light emitting diode IR, and the blue light emitting diode B may form one pixel group PXG. A plurality of pixel groups PXG may be arranged vertically and horizontally along the first direction D1 and the second direction D2 on the substrate 23.

The present specification describes an exemplary embodiment in which the pixel group PXG including the red light emitting diode R, the green light emitting diode G, the infrared ray light emitting diode IR, and the blue light emitting diode B is repeatedly arranged, however, the present invention is not limited thereto, and an exemplary embodiment in which the infrared ray light emitting diode IR is not included in all pixel groups PXG, but is only included in some pixel groups PXG, is possible. As an example, a first pixel group including the red light emitting diode R, the green light emitting diode G, and the blue light emitting diode B and a second pixel group PXG including the red light emitting diode R, the green light emitting diode G, the infrared ray light emitting diode IR, and the blue light emitting diode B may be alternately arranged. This structure is not limited to the above-described arrangement of the pixel groups, and the plurality of pixel groups may be arranged on the substrate 23 by various suitable methods. The pixel groups may be arranged while maintaining regularity for accuracy of sensing.

FIG. 2 is the schematic view showing the cross-sectional structure for one pixel group PXG shown in FIG. 1. The structure corresponding to each of the red light emitting diode R, the green light emitting diode G, the infrared ray light emitting diode IR, and the blue light emitting diode B described in FIG. 1 will now be described in more detail.

Referring to FIG. 2, in a region corresponding to the red light emitting diode R, a first electrode 120 positioned on the substrate 23, a second electrode 190 overlapping the first electrode 120, a red emission layer 150R positioned between the first electrode 120 and the second electrode 190, a hole transmitting region 130 positioned between the first electrode 120 and the red emission layer 150R, a red resonance auxiliary layer 150R' positioned between the hole transmitting region 130 and the red emission layer 150R, an electron transport region 160 positioned between the red emission layer 150R and the second electrode 190, an electron injection region 180 positioned between the electron transport region 160 and the second electrode 190, and a capping layer 200 positioned between the second electrode 190 are formed.

In a region corresponding to the green light emitting diode G, the first electrode 120, the second electrode 190 overlapping the first electrode 120, a green emission layer 150G positioned between the first electrode 120 and the second electrode 190, the hole transmitting region 130 positioned between the first electrode 120 and the green emission layer 150G, a green resonance auxiliary layer 150G' and a blocking layer 150BL positioned between the hole transmitting region 130 and the green emission layer 150G, the electron transport region 160 positioned between the green emission layer 150G and the second electrode 190, the electron injection region 180 positioned between the electron transport region 160 and the second electrode 190, and the capping layer 200 positioned on the second electrode 190 are formed.

In a region corresponding to the infrared ray light emitting diode IR, the first electrode 120, the second electrode 190 overlapping the first electrode 120, an infrared ray emission layer 150IR positioned between the first electrode 120 and the second electrode 190, the hole transmitting region 130 positioned between the first electrode 120 and the infrared ray emission layer 150IR, the electron transport region 160 positioned between the infrared ray emission layer 150IR and the second electrode 190, the electron injection region 180 positioned between the electron transport region 160 and the second electrode 190, and the capping layer 200 positioned on the second electrode 190 are formed.

In a region corresponding to the blue light emitting diode B, the first electrode 120, the second electrode 190 overlapping the first electrode 120, a blue emission layer 150B positioned between the first electrode 120 and the second electrode 190, the hole transmitting region 130 positioned between the first electrode 120 and the blue emission layer 150B, a blue auxiliary layer BIL positioned between the hole transmitting region 130 and the blue emission layer 150B, the electron transport region 160 positioned between the blue emission layer 150B and the second electrode 190, the electron injection region 180 positioned between the electron transport region 160 and the second electrode 190, and the capping layer 200 positioned on the second electrode 190 are formed.

The description may be commonly applied to the first electrode 120, the hole transmitting region 130, the electron transport region 160, the electron injection region 180, the second electrode 190, and the capping layer 200 positioned at each region corresponding to the red light emitting diode R, the green light emitting diode G, the infrared ray light emitting diode IR, and the blue light emitting diode B. Next, each emission layer and other constituent elements adjacent thereto will be described in more detail.

First, the region corresponding to the infrared ray light emitting diode IR is described in more detail. The infrared ray light emitting diode IR includes an infrared ray emission layer 150IR.

The infrared ray emission layer 150IR may emit light having a wavelength band of about 700 nanometers to about 1000 nanometers. For example, light having a wavelength band of about 850 nanometers to 950 nanometers may be emitted.

In an exemplary embodiment, the infrared ray emission layer 150IR may include the same material as the green resonance auxiliary layer 150G'. The infrared ray emission layer 150IR may include a green resonance auxiliary material and an infrared ray light emitting dopant doped to the green resonance auxiliary material.

The infrared ray light emitting dopant may include at least one among (e.g., selected from) a metal complex compound, a donor-acceptor-donor (DAD) compound, and a lanthanide compound.

In an exemplary embodiment, the metal included in the metal complex compound may include at least one selected from Pt, Pd, Cu, and Zn. The metal complex compound according to an exemplary embodiment may be a compound represented by Chemical Formula 1.

Chemical Formula 1

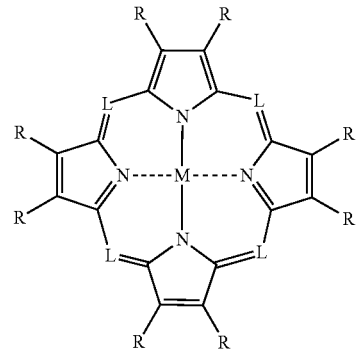

In Chemical Formula 1, L may be N or CR', and M may be Pt, Pd, Cu, Zn, Sc, Y, La, Ti, Zr, Hf, V, Nb, Ta, Cr, Mo, W, Mn, Tc, Re, Fe, Ru, Os, Co, Rh, Ir, Ni, Ag, Au, Cd, Hg, Al, Ga, In, Tl, Si, Ge, Sn, Pb, P, As, Sb, Bi, S, Se, Te, Po, Cl, Br, I, At, a lanthanide (e.g., lanthanide series) element, or an actinium group (e.g., actinide series) element.

R is each independently selected from atoms bonded to a β carbon of Cl, Br, I, At, and a pyrrole ring, the atoms bonded to the β carbon are selected from B, C, N, O, Si, P, S, Cl, Ge, As, Se, Br, In, Sn, Sb, Te, I, Tl, Pb, Bi, Po, and At, and two adjacent R groups bonded to the same pyrrole ring may form a carbocyclic group or a heterocyclic group along with two β carbons of the pyrrole ring.

In CR', R' is a phenyl group, a tolyl group, a xylenyl group, a mesityl group, a methyl group, an ethyl group, an n-propyl group, or an isopropyl group.

Next, the green light emitting diode G including the green emission layer 150G will be described in more detail.

The green emission layer 150G may include a host material including, for example, CBP or mCP, and may include a phosphorescent material including a dopant material including, e.g., Ir(ppy)3(fac-tris(2-phenylpyridine) iridium). Also, a fluorescent material including, for example, Alq3(tris(8-hydroxyquinolino)aluminum) may be included, but the present invention is not limited thereto.

The green resonance auxiliary layer 150G' may be positioned between the green emission layer 150G and the first electrode 120. The green resonance auxiliary layer 150G' is a layer added to adjust a resonance distance depending on a color.

The green resonance auxiliary layer 150G' may include a resonance auxiliary material and an infrared ray light emitting dopant doped to the resonance auxiliary material. The green resonance auxiliary layer 150G' may include the same material as the infrared ray emission layer 150IR. The green resonance auxiliary layer 150G' and the infrared ray emission layer 150IR may be formed in the same process. To be formed in the same process may mean to be formed by utilizing the same mask. As an example, the green resonance auxiliary layer 150G' and the infrared ray emission layer 150IR including the resonance auxiliary material doped with the infrared ray light emitting dopant may be formed by utilizing thermal evaporation or the like.

The green resonance auxiliary layer 150G' and the infrared ray emission layer 150IR may be positioned between pixel definition layers 25 adjacent to each other (e.g., may be on two sides of a pixel definition layer 25). According to an exemplary embodiment of the present invention, because the infrared ray emission layer 150IR may be concurrently (e.g., simultaneously) formed through the process of forming the green light emitting diode G, the display device in which the infrared ray light emitting diode IR is positioned in the display area through the simple process may be provided.

The green light emitting diode G according to an exemplary embodiment may include the blocking layer 150BL positioned between the green resonance auxiliary layer 150G' and the green emission layer 150G.

Referring to FIG. 3, representing an energy level of the green light emitting diode G, a Lowest Unoccupied Molecular Orbital (LUMO) energy of the blocking layer 150BL may be larger than a LUMO energy of the green light emitting dopant (dopant) included in the green emission layer 150G. As an example, the LUMO energy of the blocking layer 150BL may be larger than about −2.0 eV. The LUMO energy of the green light emitting dopant may be about −2.0 eV or less. The blocking layer 150BL may prevent or substantially prevent the electrons injected to the green emission layer 150G from being injected to the green resonance auxiliary layer 150G' through the blocking layer 150BL. FIG. 3 further illustrates the LUMO values and the Highest Occupied Molecular Orbital (HOMO) values of the hole injection layer (HIL), the infrared ray light emitting dopant (NIR dopant), and the electron transport region (ETL).

Triplet excitation energy T1 of the blocking layer 150BL may be larger than triplet excitation energy T1 of the green light emitting dopant. As an example, the triplet excitation energy T1 of the blocking layer 150BL may be about 2.7 eV or more. The triplet excitation energy of the emission layer 150G may be about 2.3 eV to about 2.5 eV. As the triplet excitation energy T1 of the blocking layer 150BL has a larger value than the triplet excitation energy of the emission layer 150G, the exciton of the emission layer 150G may be prevented or substantially prevented from inflowing to the green resonance auxiliary layer 150G'.

The thickness of the blocking layer 150BL may be about 150 Å or more. When the thickness of the blocking layer 150BL is less than about 150 Å, because the blocking layer 150BL slightly (e.g., only slightly) inhibits the movement of the electrons or excitons, the light emitting efficiency of the green emission layer may be deteriorated.

According to an exemplary embodiment of the present invention, the blocking layer 150BL may be positioned between the green emission layer 150G and the green resonance auxiliary layer 150G'. The green resonance auxiliary layer 150G' according to an exemplary embodiment includes the infrared ray light emitting dopant. When the green resonance auxiliary layer 150G' and the green emission layer 150G are in contact without the separate blocking layer 150BL, the electrons moving to the green emission layer 150G move to the green resonance auxiliary layer 150G' or the excitons formed in the emission layer 150G move to the green resonance auxiliary layer 150G' such that the light emitting efficiency of the green emission layer 150G may be deteriorated.

As the light emitting display device according to an exemplary embodiment of the present invention includes the blocking layer 150BL positioned between the green emission layer 150G and the green resonance auxiliary layer 150G' to prevent or reduce the unnecessary movements of the electrons or the excitons, the light emitting efficiency of the green emission layer 150G may be improved.

Next, the blue light emitting diode B including the blue emission layer 150B will be described in more detail.

The blue emission layer 150B may include the host material including, for example, CBP or mCP, and may include the phosphorescent material including a dopant material including, for example, (4,6-F2ppy)2lrpic. Alternatively, the emission layer 150 may include the host material having an anthracene group, and may be made of a fluorescent material including the dopant including a diamine group or at least one selected from spiro-DPVBi, spiro-6P, distyrylbenzene (DSB), distyrylarylene (DSA), a PFO-based polymer, and a PPV-based polymer, but the present invention is not limited thereto.

The blue auxiliary layer BIL may be positioned between the blue emission layer 150B and the first electrode 120. The blue auxiliary layer BIL may increase the light emitting efficiency of the blue emission layer 150B. In more detail, the blue auxiliary layer BIL may increase the light emitting efficiency of the blue emission layer 150B by adjusting a hole-charge balance.

Next, the red light emitting diode R including the red emission layer 150R will be described in more detail.

The red emission layer 150R includes the host material that includes, for example, CBP (carbazole biphenyl) or mCP (1,3-bis(carbazol-9-yl), and may be formed of a phosphorescent material including at least one selected from PIQIr(acac) (bis(1-phenylisoquinoline)acetylacetonate iridium), PQIr(acac) (bis(1-phenylquinoline)acetylacetonate iridium), Par (tris(1-phenylquinoline)iridium), and PtOEP (platinum octaethylporphyrin). The fluorescent material including PBD:Eu(DBM)3(Phen) or perylene may be included, but the present invention is not limited thereto.

The red resonance auxiliary layer 150R' may be positioned between the red emission layer 150R and the first electrode 120. The red resonance auxiliary layer 150R' is a layer added to adjust the resonance distance. The red resonance auxiliary layer 150R' may include a resonance auxiliary material.

It is not necessary for the red emission layer 150R, the green emission layer 150G, and the blue emission layer 150B as above-described to be made of only the organic material, and an inorganic material such as a quantum dot may be utilized.

Hereinafter, configurations that are common in the red light emitting diode R, the green light emitting diode G, the infrared ray light emitting diode IR, and the blue light emitting diode B will be described in more detail.

The first electrode 120 may be a reflecting electrode. The reflecting electrode may be an electrode including a material having a characteristic of reflecting light emitted from the emission layer 150 to be transmitted to the second electrode 190. The reflection characteristic may refer to that the reflectivity of incident light is about 70% or more to about 100% or less, or about 80% or more to about 100% or less.

The first electrode 120 may include silver (Ag), aluminum (Al), chromium (Cr), molybdenum (Mo), tungsten (W), titanium (Ti), gold (Au), palladium (Pd), or alloys thereof to be utilized as the reflection layer while having the anode function, and may have a triple layer structure of silver (Ag)/indium tin oxide (ITO)/silver (Ag) or indium tin oxide (ITO)/silver (Ag)/indium tin oxide (ITO).

The first electrode 120 may be formed by utilizing a sputtering method, a vapor phase deposition method, an ion beam deposition method, or an electron beam deposition method.

The hole transmitting region 130 may be an auxiliary region positioned between the first electrode 120 and the emission layer 150. The hole transmitting region 130 may include at least one of the hole injection region (e.g., the hole injection layer) and the hole transport region (e.g., the hole transport layer). The hole injection layer facilitates injection of holes from the first electrode 120, and the hole transport layer performs a function of smoothly transporting the holes transmitted from the hole injection layer to the emission layer 150.

The hole transmitting region 130 may be formed of a dual-layered structure in which the hole transport layer is disposed on the hole injection layer, or a single layer in which a material forming the hole injection layer and a material forming the hole transport layer are mixed.

The hole transmitting region 130 may include the organic material. For example, the hole transmitting region 130 may include NPD (N,N-dinaphthyl-N,N'-diphenyl benzidine), TPD (N,N'-bis-(3-methylphenyl)-N,N'-bis-(phenyl)-benzidine), or s-TAD, and MTDATA (4,4',4"-tris(N-3-methylphenyl-N-phenyl-amino)-triphenylamine), but the present invention is not limited thereto.

The emission layer 150 is positioned on the hole transmitting region 130. The emission layer 150 includes a light emitting material displaying a particular color. The thickness of the emission layer 150 may be about 10 nm to about 50 nm.

The emission layer 150 includes the red emission layer 150R, the green emission layer 150G, the blue emission layer 150B, and the infrared ray emission layer 150IR as above-described. They may be horizontally disposed in the direction parallel to the upper surface of the first electrode 120.

The pixel definition layer 25 may be positioned between the layers adjacent to each other among the red emission layer 150R, the green emission layer 150G, the infrared ray emission layer 150IR, and the blue emission layer 150B.

The electron transport region 160 and the electron injection region 180 may be sequentially positioned between the emission layer 150 and the second electrode 190. The electron transport region 160 is positioned to be adjacent to the emission layer 150, and the electron injection region 180 is positioned to be adjacent to the second electrode 190.

The electron transport region 160 may include the organic material. For example, the electron transport region 160 may include at least one selected from Alq3 (tris(8-hydroxyquinolino)aluminum), PBD (2-[4-biphenyl-5-[4-tert-butylphenyl]]-1,3,4-oxadiazole), TAZ (1,2,4-triazole), spiro-PBD (spiro-2-[4-biphenyl-5-[4-tert-butylphenyl]]-1,3,4-oxadiazole), and BAlq (8-hydroxyquinoline beryllium salt), however, the present invention is not limited thereto.

The electron transport region 160 may transport the electrons injected from the second electrode 190 to the emission layer 150. Also, the electron transport region 160 may prevent or substantially prevent the holes injected from the first electrode 120 from moving to the second electrode 190 through the emission layer 150. The electron transport region 160 acts as a hole blocking layer, and helps the combination of the holes and the electrons in the emission layer 150.

The electron injection region 180 acts to improve the electron injection from the second electrode 190 to the electron transport region 160.

The electron injection region 180 may include an ionic compound of which a first component and a second component are combined. The first component may be an element that becomes a positive ion and the second component may be an element that becomes a negative ion when the ionic compound is ionized.

In an exemplary embodiment, the thickness of the electron injection region 180 may be about 2 Å to 25 Å.

In the exemplary embodiment, the second electrode 190 may include an alloy made of two or more metal elements selected from silver (Ag), magnesium (Mg), aluminum (Al), and ytterbium (Yb). The second electrode 190 may include AgMg or AgYb, and a content of the Ag of the second electrode 190 may be more than that of Mg or Yb thereof. The content of Mg or Yb may be about 10 vol %.

The second electrode 190 may be formed by a sputtering method, a vapor phase deposition method, an ion beam deposition method, an electron beam deposition method, or the like, but the present invention is not limited thereto.

The capping layer 200 may include an organic capping layer made of the organic material, an inorganic capping layer made of the inorganic material, or a composite capping layer including the organic material and the inorganic material. The capping layer 200 may include at least one layer.

The capping layer 200 may include at least one selected from a carbocyclic compound, a heterocyclic compound, an amine compound, porphyrin derivatives, phthalocyanine derivatives, naphthalocyanine derivatives, an alkali metal complex, and an alkaline earth metal complex. The carbocyclic compound, the heterocyclic compound, and the amine compound may be selectively substituted with a substituent including at least one selected from O, N, S, Se, Si, F, Cl, Br, and I. According to the exemplary embodiment, the capping layer 200 may independently include the amine compound.

Figure 4:
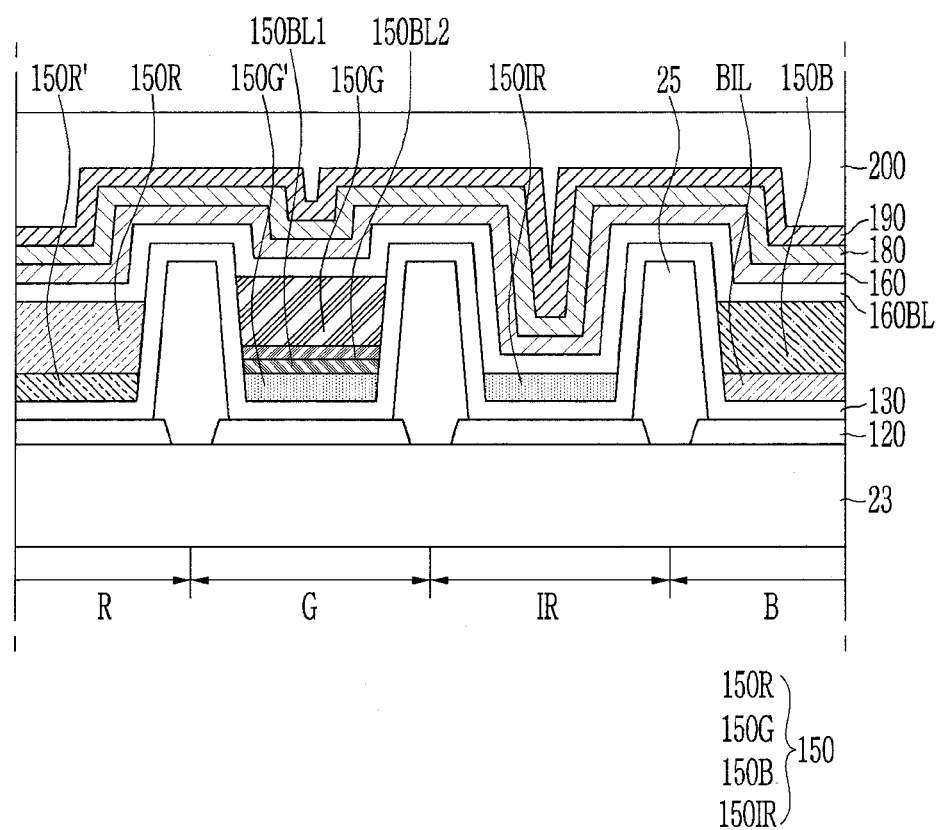
FIG. 4 is a cross-sectional view according to a variation exemplary embodiment of FIG. 2.

Next, the light emitting display device according to an exemplary embodiment of the present invention will be described with reference to FIG. 4. FIG. 4 is a cross-sectional view according to a variation (e.g., another) exemplary embodiment of FIG. 2, and the description of the same constituent elements as the above-described constituent elements may not be repeated.

The light emitting display device according to the exemplary embodiment of FIG. 4 includes a plurality of blocking layers 150BL1 and 150BL2 positioned between the green emission layer 150G and the green resonance auxiliary layer 150G'.

The blocking layers 150BL1 and 150BL2 according to the variation exemplary embodiment may have a structure in which a plurality of layers is stacked. The present specification shows the blocking layers that are made of two layers 150BL1 and 150BL2, however, the present invention is not limited thereto, and more than two layers may be included.

Each LUMO energy of the plurality of blocking layers 150BL1 and 150BL2 may be larger than the LUMO energy of the green light emitting dopant included in the green emission layer 150G. Also (alternatively), at least one LUMO energy of the plurality of blocking layers 150BL1 and 150BL2 may be larger than the LUMO energy of the green light emitting dopant included in the green emission layer 150G. As an example, the LUMO energy of at least one blocking layers 150BL1 and 150BL2 may be larger than about −2.0 eV.

Each triplet excitation energy T1 of the plurality of blocking layers 150BL1 and 150BL2 may be larger than the triplet excitation energy T1 of the green light emitting dopant. Also (alternatively), the triplet excitation energy T1 of at least one of the plurality of blocking layers 150BL1 and 150BL2 may be larger than the triplet excitation energy T1 of the green light emitting dopant. As an example, the triplet excitation energy T1 of at least one of the plurality of blocking layers 150BL1 and 150BL2 may be about 2.7 eV or more.

A sum of the thicknesses of the plurality of blocking layers 150BL1 and 150BL2 may be about 150 Å or more. When the entire thickness is less than about 150 Å, the blocking layers 150BL1 and 150BL2 slightly (e.g., only slightly) inhibit the movement of the electrons such that the light emitting efficiency of the green emission layer may be deteriorated.

Also, the light emitting display device according to an exemplary embodiment may further include a buffer layer 160BL positioned between the emission layer 150 and the electron transport region 160. The buffer layer 160BL may effectively control an amount of the electrons injected to the emission layer 150.

Next, the light emitting efficiency of the light emitting display device according to an exemplary embodiment and a comparative example will be described with reference to Table 1 to Table 3.

Comparative Example 1 is an element (e.g., a light emitting diode) including the green emission layer and the green resonance auxiliary layer, which includes only the resonance auxiliary material in the green resonance auxiliary layer, and Comparative Example 2 is an element including the green emission layer and the green resonance auxiliary layer, which includes (e.g., further includes) the infrared ray light emitting dopant in the green resonance auxiliary layer. Comparative Example 3, Comparative Example 4, Exemplary Embodiment 1, and Exemplary Embodiment 2 are elements further including the blocking layer having physical properties according to Table 1 along with the green emission layer and the green resonance auxiliary layer including the infrared ray light emitting dopant.

TABLE 1

|  | HOMO (eV) | LUMO (eV) | T1 (eV) |
| --- | --- | --- | --- |
| Comparative Example 3 | −5.38 | −2.92 | 2.19 |
| Comparative Example 4 | −5.21 | −1.88 | 2.58 |
| Exemplary Embodiment 1 | −5.39 | −1.79 | 2.73 |
| Exemplary Embodiment 2 | −5.28 | −1.81 | 2.74 |
| Green emission layer | −5.39 | −2.88 | — |

The light emitting efficiency of the light emitting diodes according to Comparative Examples 1 to 4 and Exemplary Embodiments 1 and 2 is shown in Table 2.

TABLE 2

|  | Op. V* | Cd/A** | CIE_x | CIE_y |
| --- | --- | --- | --- | --- |
| Comparative Example 1 | 4.1 | 156.6 | 0.234 | 0.728 |
| Comparative Example 2 | 4.6 | 140.2 | 0.231 | 0.732 |
| Comparative Example 3 | 5.0 | 85.3 | 0.231 | 0.730 |
| Comparative Example 4 | 5.1 | 104.2 | 0.241 | 0.723 |
| Exemplary Embodiment 1 | 4.7 | 157.1 | 0.233 | 0.729 |
| Exemplary Embodiment 2 | 5.3 | 156.8 | 0.231 | 0.731 |

*driving voltage
**light emitting efficiency

According to Table 2, in the case of Comparative Example 2 in which the green resonance auxiliary layer includes the infrared ray light emitting dopant to form the infrared ray light emitting diode in the display area, compared with Comparative Example 1 in which the green resonance auxiliary layer does not include the infrared ray light emitting dopant, the light emitting efficiency decreases by about 10%. The efficiency deterioration due to the movement of the electrons or the excitons positioned in the emission layer by the green resonance auxiliary layer including the infrared ray light emitting dopant may be observed.

To solve this problem, in Comparative Example 3, Comparative Example 4, Exemplary Embodiment 1, and Exemplary Embodiment 2, the blocking layer having the predetermined physical properties may be positioned between the green resonance auxiliary layer and the green emission layer.

However, referring to Table 2, it is confirmed that the light emitting efficiency of the light emitting diode is not improved by simply including the blocking layer. In more detail, in Exemplary Embodiment 1 and Exemplary Embodiment 2, when the LUMO energy of the blocking layer is −2.0 eV or more and the triplet excitation energy is 2.7 eV or more, it is confirmed that light emitting efficiency of a similar level to Comparative Example 1 in which the green resonance auxiliary layer does not include the separate infrared ray light emitting dopant appears (e.g., is achieved). Also, in Exemplary Embodiment 1 and Exemplary Embodiment 2, it is confirmed that the light emitting efficiency is improved by a considerable level (e.g., a significant amount) compared with Comparative Example 2 having the green resonance auxiliary layer including the infrared ray light emitting dopant.

However, in the case of Comparative Example 3 and Comparative Example 4 in which the LUMO energy of the blocking layer is smaller than −2.0 eV or the triplet excitation energy is smaller than 2.7 eV, it is confirmed that the light emitting efficiency decreases considerably (e.g., significantly) compared with Comparative Example 1 and Comparative Example 2.

Next, the light emitting efficiency depending on the thickness of the blocking layer will be described with reference to Table 3. In table 3, Comparative Example 5, Exemplary Embodiment 3 and Exemplary Embodiment 4 have similar structures except for the thickness of the blocking layer. In more detail, Comparative Example 5 is an element in which the thickness of the blocking layer is 100 Å, Exemplary Embodiment 3 is an element in which the thickness of the blocking layer is 150 Å, and Exemplary Embodiment 4 is an element in which the thickness of the blocking layer is 250 Å.

TABLE 3

| Element | Op. V | Cd/A | CIE_x | CIE_y |
| --- | --- | --- | --- | --- |
| Comparative Example 1 | 4.1 | 156.6 | 0.234 | 0.728 |
| Comparative Example 5 | 4.9 | 148.7 | 0.238 | 0.727 |
| Exemplary Embodiment 3 | 5.0 | 156.9 | 0.239 | 0.725 |
| Exemplary Embodiment 4 | 5.1 | 158.3 | 0.227 | 0.733 |

As a result of examining the light emitting efficiency of the light emitting diodes according to Comparative Example 5, Exemplary Embodiment 3, and Exemplary Embodiment 4, as shown in Table 3, in Exemplary Embodiment 3 and Exemplary Embodiment 4 in which the thickness of the blocking layer is about 150 Å or more, light emitting efficiency of a level that is similar to Comparative Example 1 or better appears (is achieved), however in the case of Comparative Example 5 in which the thickness of the blocking layer is 100 Å, it is confirmed that the light emitting efficiency is deteriorated compared with Comparative Example 1.

To effectively prevent or substantially prevent the electrons and the excitons from being injected into the green resonance auxiliary layer, it is confirmed that the blocking layer with at least a 150 Å thickness must be included.

Figure 5:
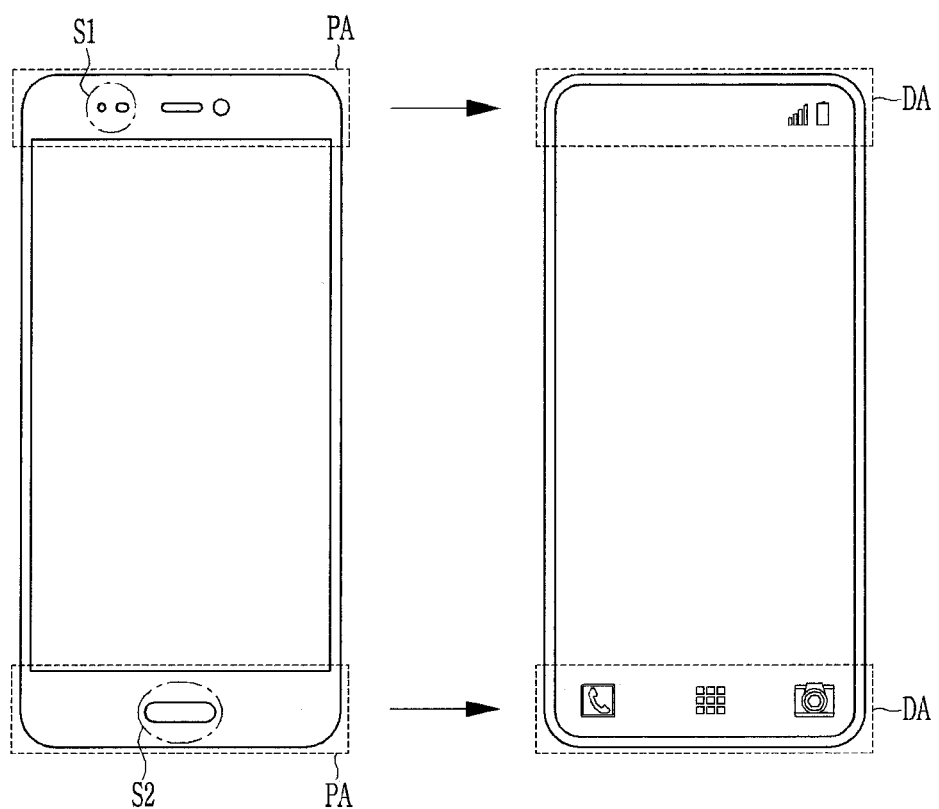
FIG. 5 is a schematic view showing a light emitting display device including an infrared ray light emitting diode according to an exemplary embodiment of the present invention.

Next, the light emitting display device according to an exemplary embodiment of the present invention will be described with reference to FIG. 5. FIG. 5 is a schematic view showing a light emitting display device forming (e.g., including) an infrared ray light emitting diode according to an exemplary embodiment of the present invention.

A left view (i.e., the left portion) of FIG. 5 relates to the light emitting display device in which a first sensor S1 and a second sensor S2 are positioned in the peripheral area PA. In this case, the first sensor S1 may serve as a proximity sensor, and the second sensor S2 may serve as a fingerprint sensor by applying a physical button. For this light emitting display device, a sensor module must be manufactured separately from the light emitting diode such that the process may be complicated.

A right view (i.e., the right portion) of FIG. 5 is the light emitting display device in which the display area DA is expanded to the periphery of the display device. As the arrangement of the plurality of light emitting diodes according to the above-described exemplary embodiments of the present invention is applied, the physical button is removed as shown in the right view of FIG. 5, thereby implementing the light emitting display device capable of substantially displaying at the entire surface.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SOME OF THE SYMBOLS

R: red light emitting diode
G: green light emitting diode
B: blue light emitting diode
IR: infrared ray light emitting diode
150: emission layer

What is claimed is:

1. A light emitting display device comprising:
a first electrode on a substrate;
a second electrode overlapping the first electrode;
a red emission layer, a green emission layer, a blue emission layer, and an infrared ray emission layer between the first electrode and the second electrode and emitting light of different wavelengths from each other;
a green resonance auxiliary layer between the green emission layer and the first electrode; and
a blocking layer between the green resonance auxiliary layer and the green emission layer,
wherein the infrared ray emission layer and the green resonance auxiliary layer comprise the same material,
the green emission layer comprises a green light emitting dopant, and
a Lowest Unoccupied Molecular Orbital (LUMO) energy of the blocking layer is larger than a LUMO energy of the green light emitting dopant.

2. The light emitting display device of claim 1, wherein the LUMO energy of the blocking layer is larger than −2.0 eV.

3. The light emitting display device of claim 1, wherein triplet excitation energy T1 of the blocking layer is larger than triplet excitation energy T1 of the green light emitting dopant.

4. The light emitting display device of claim 1, wherein a triplet excitation energy T1 of the blocking layer is 2.7 eV or more.

5. The light emitting display device of claim 1, wherein a thickness of the blocking layer is 150 Å or more.

6. The light emitting display device of claim 1, wherein the blocking layer comprises at least two layers.

7. The light emitting display device of claim 1, wherein the infrared ray emission layer and the green resonance auxiliary layer are positioned on a same layer.

8. The light emitting display device of claim 1, wherein the infrared ray emission layer and the green resonance auxiliary layer comprise an infrared ray light emitting dopant.

9. The light emitting display device of claim 8, wherein the infrared ray light emitting dopant comprises at least one selected from a metal complex compound, a donor-acceptor-donor (DAD) compound, and a lanthanide compound.

10. A light emitting display device comprising:
a first electrode on a substrate;
a second electrode overlapping the first electrode;
a red emission layer, a green emission layer, a blue emission layer, and an infrared ray emission layer between the first electrode and the second electrode and emitting light of different wavelengths from each other;
a green resonance auxiliary layer between the green emission layer and the first electrode; and
a blocking layer between the green resonance auxiliary layer and the green emission layer,
wherein the infrared ray emission layer and the green resonance auxiliary layer comprise a same material,
the green emission layer comprises a green light emitting dopant, and
triplet excitation energy T1 of the blocking layer is larger than triplet excitation energy T1 of the green light emitting dopant.

11. The light emitting display device of claim 10, wherein a Lowest Unoccupied Molecular Orbital (LUMO) energy of the blocking layer is larger than LUMO energy of the green light emitting dopant included in the green emission layer.

12. The light emitting display device of claim 10, wherein a Lowest Unoccupied Molecular Orbital (LUMO) energy of the blocking layer is larger than −2.0 eV.

13. The light emitting display device of claim 10, wherein the triplet excitation energy T1 of the blocking layer is 2.7 eV or more.

14. The light emitting display device of claim 10, wherein a thickness of the blocking layer is 150 Å or more.

15. The light emitting display device of claim 10, wherein the blocking layer comprises at least two layers.

16. The light emitting display device of claim 10, wherein the infrared ray emission layer and the green resonance auxiliary layer are positioned on a same layer.

17. The light emitting display device of claim 10, wherein the infrared ray emission layer and the green resonance auxiliary layer comprise an infrared ray light emitting dopant.

18. The light emitting display device of claim 17, wherein the infrared ray light emitting dopant comprises at least one selected from a metal complex compound, a donor-acceptor-donor (DAD) compound, and a lanthanide compound.

* * * * *